United States Patent
Penney

(10) Patent No.: US 10,360,951 B1
(45) Date of Patent: Jul. 23, 2019

(54) INTERNAL WRITE ADJUST FOR A MEMORY DEVICE

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/875,651

(22) Filed: Jan. 19, 2018

(51) Int. Cl.
| | |
|---|---|
| *G11C 7/00* | (2006.01) |
| *G11C 7/10* | (2006.01) |
| *G06F 13/16* | (2006.01) |
| *G06F 1/08* | (2006.01) |
| *G11C 7/22* | (2006.01) |
| *G11C 8/12* | (2006.01) |

(52) U.S. Cl.
CPC .............. *G11C 7/1012* (2013.01); *G06F 1/08* (2013.01); *G06F 13/1689* (2013.01); *G11C 7/1066* (2013.01); *G11C 7/1087* (2013.01); *G11C 7/22* (2013.01); *G11C 8/12* (2013.01)

(58) Field of Classification Search
CPC ... G11C 7/1012; G11C 7/1066; G11C 7/1087; G11C 7/22; G11C 8/12; G06F 1/08; G06F 13/1689
See application file for complete search history.

(56) References Cited

U.S. PATENT DOCUMENTS

| | | | | |
|---|---|---|---|---|
| 7,826,281 | B2* | 11/2010 | Nakashima | G06F 13/1689 365/189.15 |
| 8,121,237 | B2* | 2/2012 | Stott | G11C 7/1051 365/193 |
| 10,063,234 | B1* | 8/2018 | Mazumder | G11C 7/1039 |
| 10,176,862 | B1* | 1/2019 | Penney | G11C 11/4076 |
| 2006/0250882 | A1 | 11/2006 | Choi et al. | |
| 2010/0067314 | A1* | 3/2010 | Ware | G06F 13/1689 365/189.15 |
| 2013/0308401 | A1 | 11/2013 | Yang | |
| 2014/0177361 | A1 | 6/2014 | Kitagawa | |
| 2014/0258607 | A1* | 9/2014 | Shim | G11C 7/1072 711/105 |
| 2017/0070219 | A1* | 3/2017 | Ichida | H03K 5/134 |
| 2017/0186470 | A1 | 6/2017 | Lee et al. | |
| 2017/0309320 | A1 | 10/2017 | Ishibashi et al. | |
| 2018/0151207 | A1* | 5/2018 | Kondo | G11C 7/1039 |

OTHER PUBLICATIONS

International Search Report and Written Opinion dated Jan. 28, 2019 in Application No. PCT/US2018/055852.

* cited by examiner

*Primary Examiner* — Toan K Le
(74) *Attorney, Agent, or Firm* — Fletcher Yoder, P.C.

(57) ABSTRACT

Methods and systems for internal timing schemes are provided. A data strobe (DQS) signal is received at a memory device. The DQS signal is shifted in a negative direction relative to a clock of the memory device to cause a fail point of a flip flop of the memory device. After causing the fail point, the DQS signal is shifted in a positive direction relative to the clock. A transition edge of an internal write signal (IWS) is centered in a DQS period, such as a write preamble. The IWS indicates that a write command is to be captured. Moreover, centering the transition edge includes selectively delaying the IWS in the negative direction.

20 Claims, 8 Drawing Sheets

INTERNAL WRITE ADJUST FOR A MEMORY DEVICE

BACKGROUND

Field of the Present Disclosure

Embodiments of the present disclosure relate generally to the field of semiconductor devices. More specifically, embodiments of the present disclosure relate to synchronizing write timings.

Description of Related Art

Semiconductor devices (e.g., memory devices) utilize timing with phase shifts of data signals, data strobes, and/or other signals to perform operations. However, separate signals and/or strobes may vary with relation to each other reducing performance of the semiconductor device without some accounting for such variation. As frequencies of the signals increase, these timings may become tighter and more difficult to synchronize together.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A double data rate type five synchronous dynamic access memory (DDR5 SDRAM) device may include a specification of DDR5 that includes internal write leveling that includes a final positive phase shift of a data strobe (DQS) signal by a host device. The internal write leveling may include timing skew compensation logic that identifies for internal/skew timing. In other words, write leveling trains a DQS-to-Clk transition to resolve potential fluctuations and ambiguities. However, this resolution shifts the DQS. The amount of the final positive phase shift in the write leveling may conflict with an internal write signal (IWS) of the DDR5 SDRAM device because the IWS is to be aligned with the DQS. The IWS is an internalization of the write command generated from a clock for the DDR5 SDRAM device that is used to capture the write command and begin writing in the DDR5 SDRAM device. To address this issue, the DDR5 SDRAM device may shift the IWS signal positive along with the DQS signal (possibly by different amounts) to compensate DQS shift relative to the phase relationship between IWS and the DQS signal.

Figure 1:
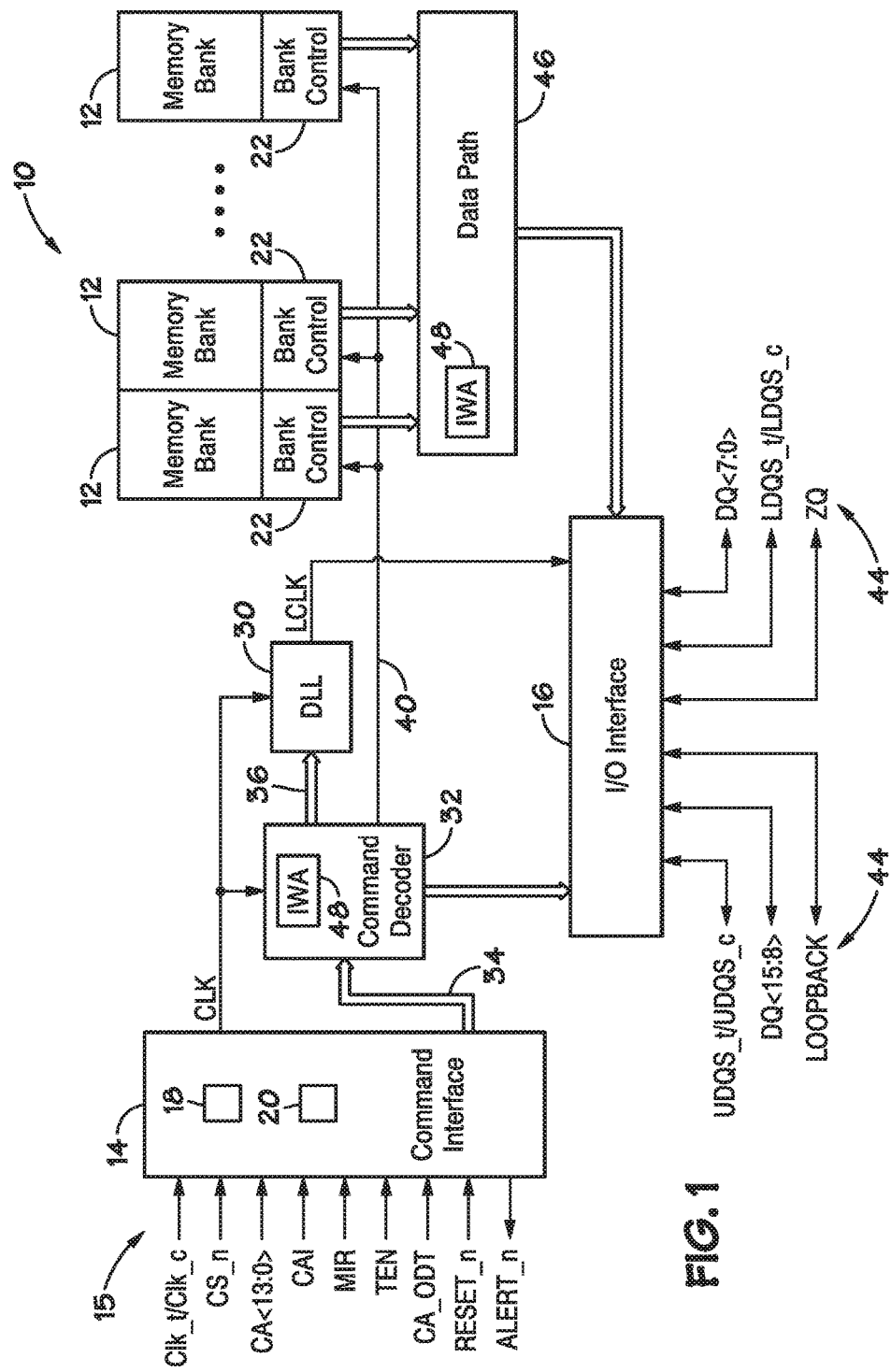
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQSt/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

As illustrated in FIG. 1, the command decoder 32 and/or the datapath 46 may include internal write adjust (IWA) circuitry 48 that may be used to phase shift the IWS and/or the DQS to maintain a specified phase relationship therebetween. For example, an embodiment of the IWA circuitry 48, as discussed in reference to FIG. 10 below, may utilize write leveling shifts and an IWS shift to align the IWS and the DQS in the proper position relative each other.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
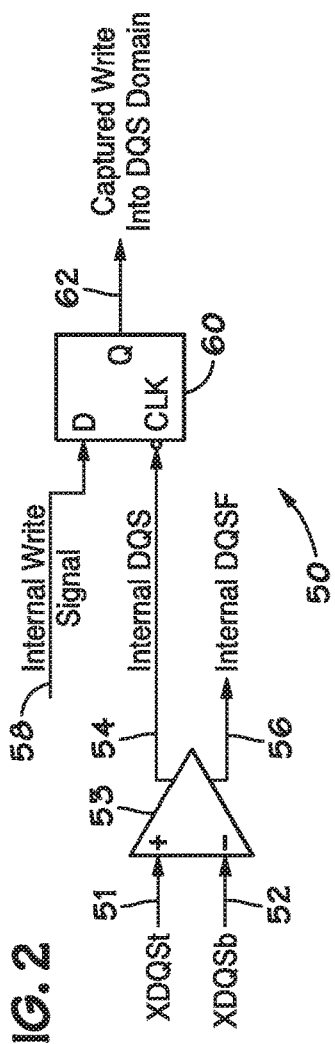
FIG. 2 is a schematic diagram of write capture circuitry that may be implemented in the command decoder and/or the data path of the memory device of FIG. 1, according to an embodiment of the present disclosure.

FIG. 2 is a schematic diagram of write capture circuitry 50 that may be implemented in the command decoder 32 and/or the datapath 46 that does not utilize the IWA circuitry 48. The write capture circuitry 50 receives an external DQS (XDQSt) signal 51 (e.g., UDQS_t) that runs at the same speed as an external clock and may be turned on or off. In some embodiments, the external DQS signal 51 may be accompanied by an external bar DQS (XDQSb) signal 52 that is complementary to the external DQS signal 51. These signals may be transmitted to an amplifier 53 to provide an internal DQS signal 54 and/or a complementary internal DQS false signal 56. The amplifier 53 changes the power of the external DQS signal 51 from an external level to a level appropriate for use in the memory device 10.

The internal DQS signal 54 is used to capture the IWS 58 in the data path 46 using a flip flop 60 on a correct cycle to successfully begin a write burst and capture incoming write data using a captured write 62 that is in the DQS domain. The external DQS signal 51 and an external clock signal that generates the IWS 58 may have an unknown phase relationship between them, but the a crossing of the clock domain (e.g., IWS 58) into the DQS domain is to occur at the flip flop 60. Therefore, the phase relationship of the external DQS signal 51 is to be calibrated with respect to the external clock to put the external DQS signal 51 in a position to properly capture the IWS 58 and allow some degree of external variation. Also, in some embodiments, as illustrated, the flip flop 60 may capture the IWS 58 at the falling edge of the internal DQS signal 54. Additionally or alternatively, the IWS 58 may be captured at the rising edge of the internal DQS signal 54.

Figure 3:
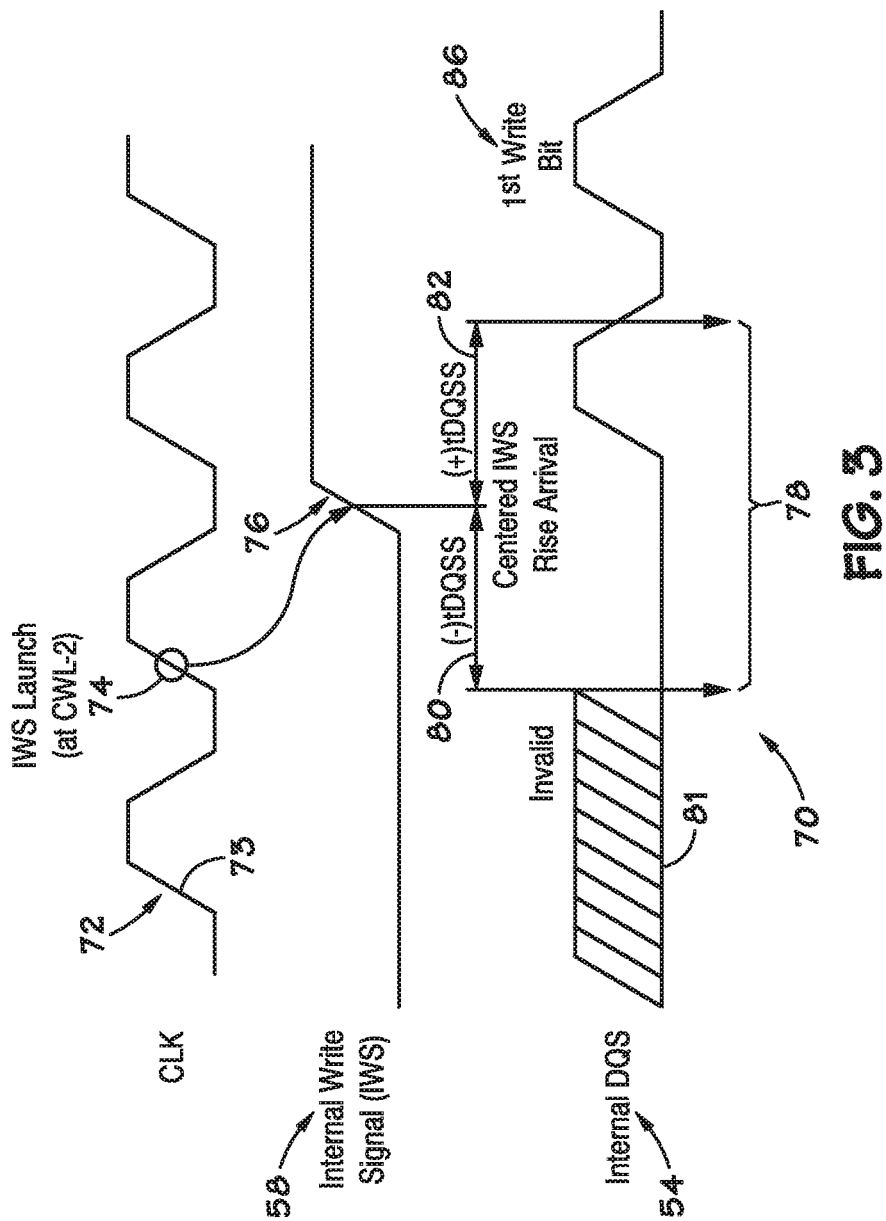
FIG. 3 is a timing diagram showing an internal data strobe (DQS) signal and an internal write signal (IWS) used in the write capture circuitry of FIG. 2, according to an embodiment of the present disclosure.

FIG. 3 illustrates a timing diagram 70 showing the internal DQS signal 54 and the IWS 58. The timing diagram 70 also includes a clock 72 used to generate the IWS 58. For example, the clock 72 is used to launch the IWS 58 at a IWS launch 74. In the illustrated embodiment, the IWS launch 74 corresponds to a second clock edge, using double data rate, after an initial clock edge 73 due to a write preamble length of 2. The edge 76 causes the IWS 58 to transition high at edge 76. The edge 76 occurs during a DQS period 78 (e.g., a whole or partial write preamble period). In some embodiments, the edge 76 is in the center of the DQS period 78. In some embodiments, the edge 76 is not centered in the DQS period 78. Regardless of position of the edge 76 relative to the DQS period 78, the edge 76 may be a negative variation window 80, (−)tDQSS, from a beginning of the DQS period 78 occurring after the internal DQS signal 54 transitions from an indeterminate or invalid state 81. Similarly, the edge 76 may be a positive variation window 82, (+)tDQSS, from an end of the DQS period 78 as the last edge of the internal DQS signal 54 prior to a first write bit edge 86 of the DQS signal 54. When the negative variation window 80 and the positive variation window 82 are equal, the edge 76 is centered in the DQS period 78. Since the illustrated embodiment includes a 1.5 clock cycle (tCKs) duration for the DQS period 78, a centered edge 76 would occur when the negative variation window 80 and the positive variation window 82 are both equal to 0.75 tCK. Moreover, these negative variation window 80 and/or the positive variation window 82 may defined for communication between the host device and the memory device 10.

Figure 4:
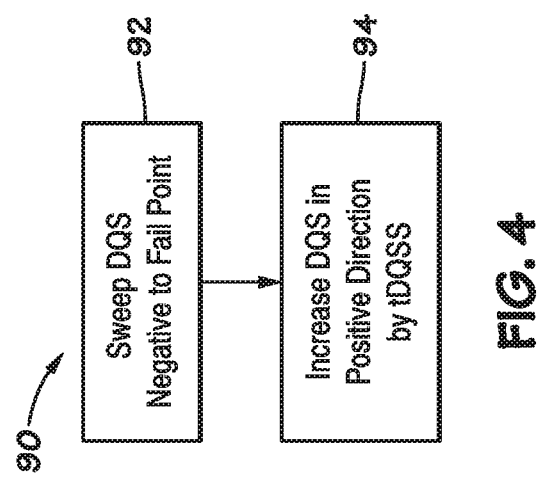
FIG. 4 is a flow diagram of a process for calibrating timing for the memory device of FIG. 1, according to an embodiment of the present disclosure.

To achieve the timing illustrated in the timing diagram 70, the host device may employ a calibration procedure to center the edge 76 in the DQS period 78. FIG. 4 is a flow diagram view of a process 90 for calibrating timing for the memory device 10. First, the host device sweeps the DQS signal 54 in a negative direction relative to the clock fail point (block 92). The host device then increases the delay/shifts in DQS as a movement in the positive direction by tDQSS (block 94).

Figure 5:
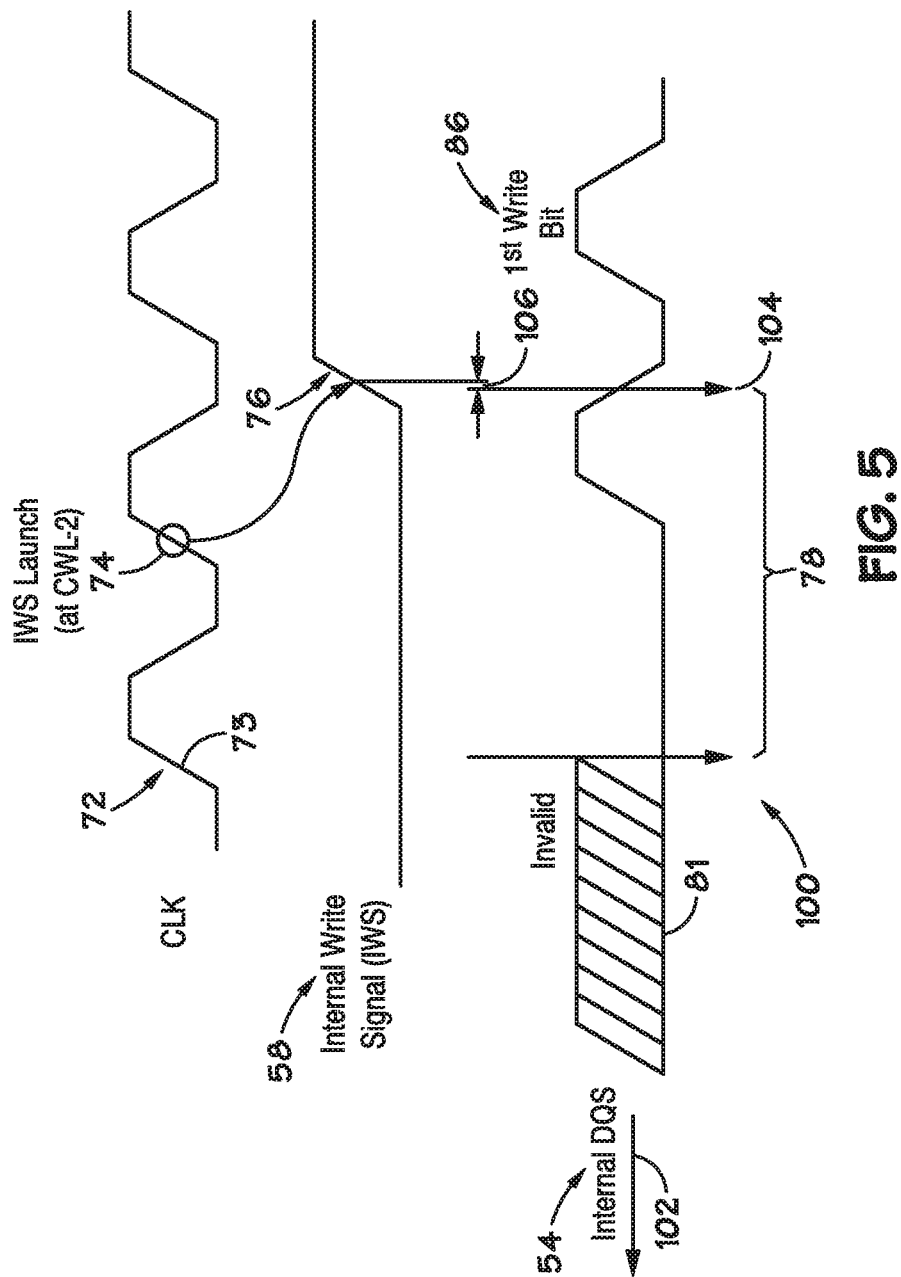
FIG. 5 is a timing diagram showing a negative sweep of the internal DQS signal by moving the internal DQS signal in a negative direction in the process 90, according to an embodiment of the present disclosure.

FIG. 5 is a timing diagram 100 showing a negative sweep 102 of the internal DQS signal 54 by moving the internal DQS signal 54 in a negative (e.g., left) direction relative to the clock 72 corresponding to block 92 of the process 90. The negative sweep 102 of the internal DQS signal 54 moves the internal DQS signal 54 until a fail point 104 occurs. The fail point 104 corresponds to a negative setup time 106 for the flip flop 60 to capture the IWS 58 with the internal DQS signal 54, so the capture fails.

Figure 6:
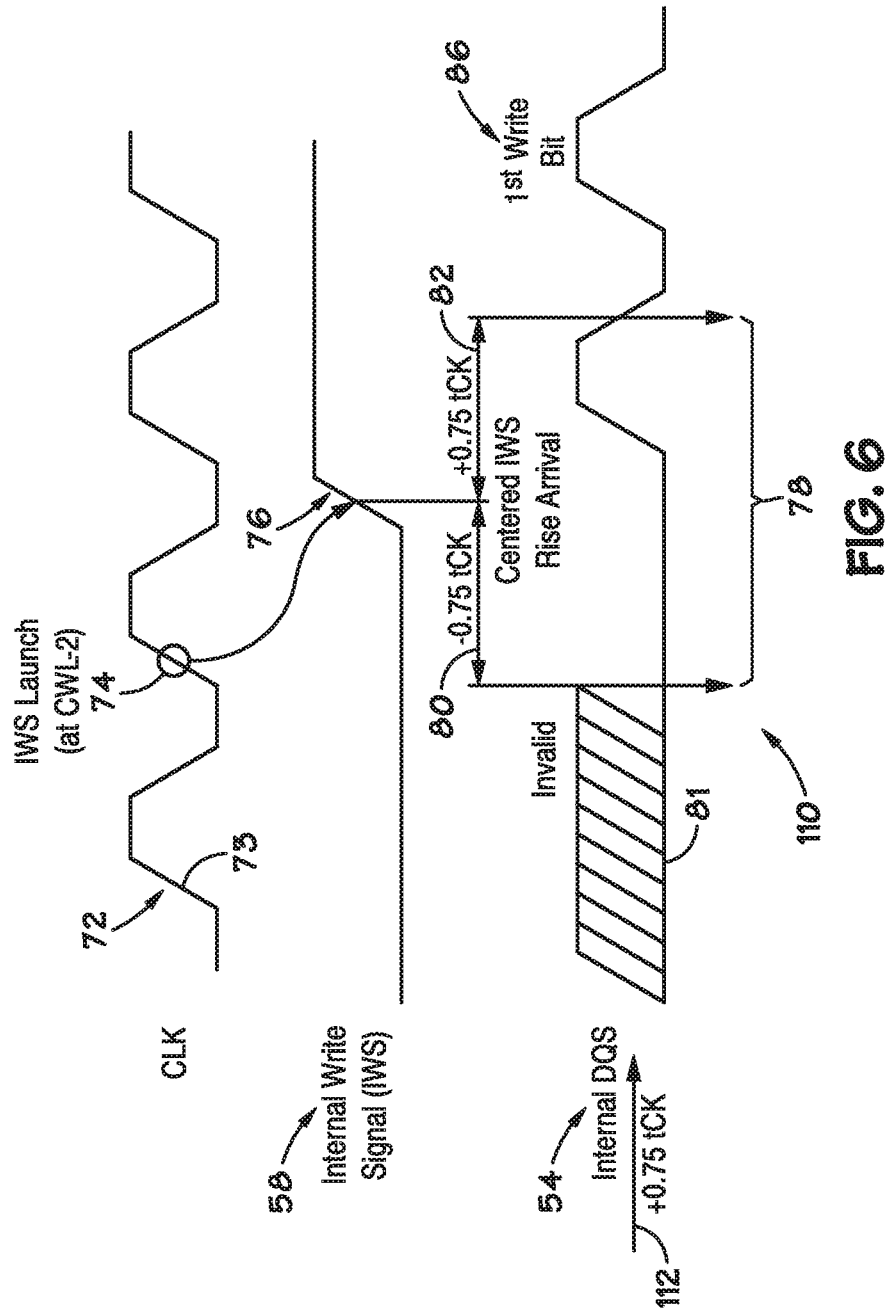
FIG. 6 is a timing diagram showing an increment of the internal DQS signal in the process after the negative sweep, according to an embodiment of the present disclosure.

FIG. 6 is a timing diagram 110 showing an increment 112 of the internal DQS signal 54 corresponding to the block 94 of the process 90 after the negative sweep 102. As illustrated, to center the IWS 58 in the DQS period 78, the increment 112 may be set to half of internal DQS signal 54. However, an available signal, such as a write leveling signal (e.g., tWL_ADJ_end), may not occur at the proper time. For example, the available signal may shift the internal DQS signal 54 by an amount (e.g., 1.25 tCKs) greater than a length (e.g., 0.75 tCKs) of the positive variation window 82 leading to a centering of the IWS 58 in the DQS period 54.

Figure 7:
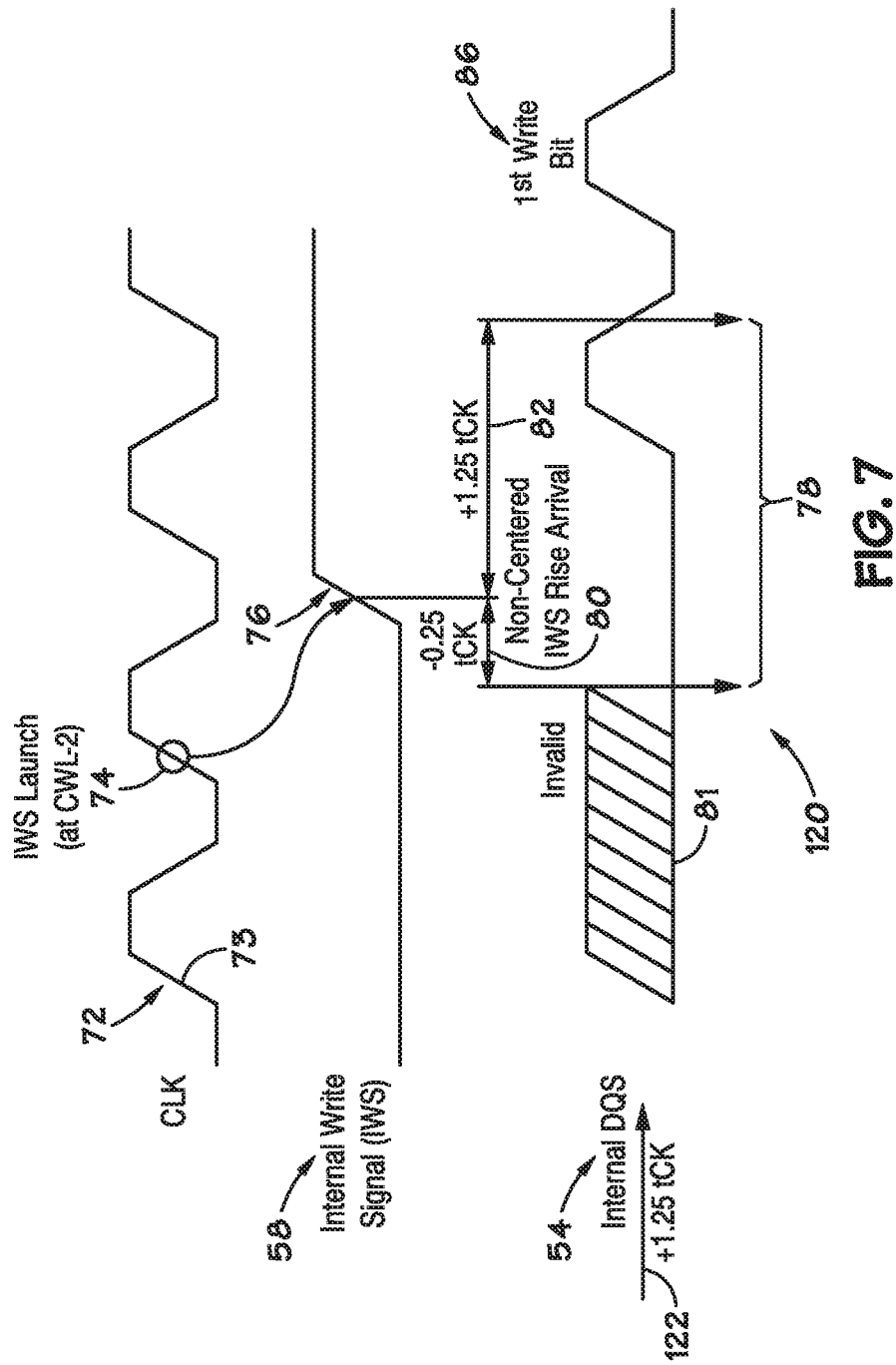
FIG. 7 is a timing diagram showing a shift using a write leveling signal that introduces an overshift for the internal DQS signal, according to an embodiment of the present disclosure.

FIG. 7 is a timing diagram 120 showing a shift 122 using the tWL_ADJ_end that introduces the shift 122 of 1.25 tCKs for the internal DQS signal 54. As illustrated, shifting the internal DQS signal 54 using the tWL_ADJ_end causes the internal DQS signal 54 to shift too far relative to the IWS 58 and the clock 72 to center the DQS period 78 on the edge 76. Indeed, for example, when the tWL_ADJ_end is 1.25 tCK and the DQS period 78 has a length of 1.5 tCK, a window for the positive variation window 82 is increased to 1.25 tCK and a window for the negative variation window 80 reduces to 0.25 tCKs. The reduction of the negative variation window 80 may cause the memory device 10 to deviate from the specification for interaction between the memory device 10 and the host device (e.g., controller) and/or may cause communication issues between the memory device 10 and the host device.

In some embodiments, the memory device 10 may utilize external write leveling with a training step to set edges for write operations. After the external write leveling training step is completed, the host DQS_t/DQS_c signals are aligned to the pin-level write leveling timing, the host will apply a negative offset (tWL_ADJ_start) to the DQS_t/DQS_c timings. The tWL_ADJ_start offset is dependent on the write preamble setting. This will be a reference point for the internal write leveling pulse to align to through the use of internal cycle alignment settings. After the internal cycle alignment setting has been adjusted to determine the sample of the high part of the internal write leveling pulse, the host will do a fine sweep of the DQS_t/DQS_c timings to determine the location of the rising edge of the internal write leveling pulse. Once this edge has been aligned, the host will then apply the final tWL_ADJ_end setting, which is also dependent on the write preamble setting. This will result in an offset that is between −0.5 tCK and 0.5 tCK. Table 1 below includes possible tWL_ADJ_start and tWL_ADJ_end timings for various write preamble lengths.

TABLE 1

Write preamble and write level training timings.

| Preamble | tWL_ADJ_end | tWL_ADJ_end |
|---|---|---|
| 1 tCK | 0.0 tCK | 0.5 tCK |
| 2 tCK | −0.75 tCK | 1.25 tCK |
| 3 tCK | −1.25 tCK | 1.75 tCK |
| 4 tCK | −1.75 tCK | 2.25 tCK |

For each preamble setting, the DQS period 78 has a duration of the write preamble minus 0.5 tCK. In some embodiments, the write preamble extends to end with a first rising edge of the DQS signal 54 that corresponds to the first write bit 86. To center the edge 76 in the DQS period 78 by shifting the internal DQS signal 54 alone, the shift of the internal DQS signal 54 would be determined by $$\text{shift} = \frac{L_{pre} - 0.5 \text{ tCK}}{2},$$

where $L_{pre}$ is the length of the preamble. For example, the shift for a preamble of one would result in a 0.75 tCK shift, a shift for a preamble of two would result in a 1.25 tCK shift, and a shift for a preamble of three would result in a 1.75 tCK shift. Write leveling training DQS-to-Clk is shifted by the tWL_ADJ_end. However, this shift is greater than the shift calculated above. For example, the shift for a preamble of two should be 0.75 tCK, but tWL_ADJ_end is 1.25 tCK. Accordingly, as discussed below, the IWS 58 may be shifted by the difference (e.g., 1.25 tCK−0.75 tCK=0.5 tCK). Furthermore, for preamble lengths of 2, 3, and 4, a shift of the IWS 58 may center the edge 76 of the IWS 58 in the DQS period 78 may be accomplished with a common shift length (e.g., 0.5 tCK). The preamble length of one may forego a shift of the IWS 58. In some embodiments, other write preamble lengths may have different shift lengths.

Figure 8:
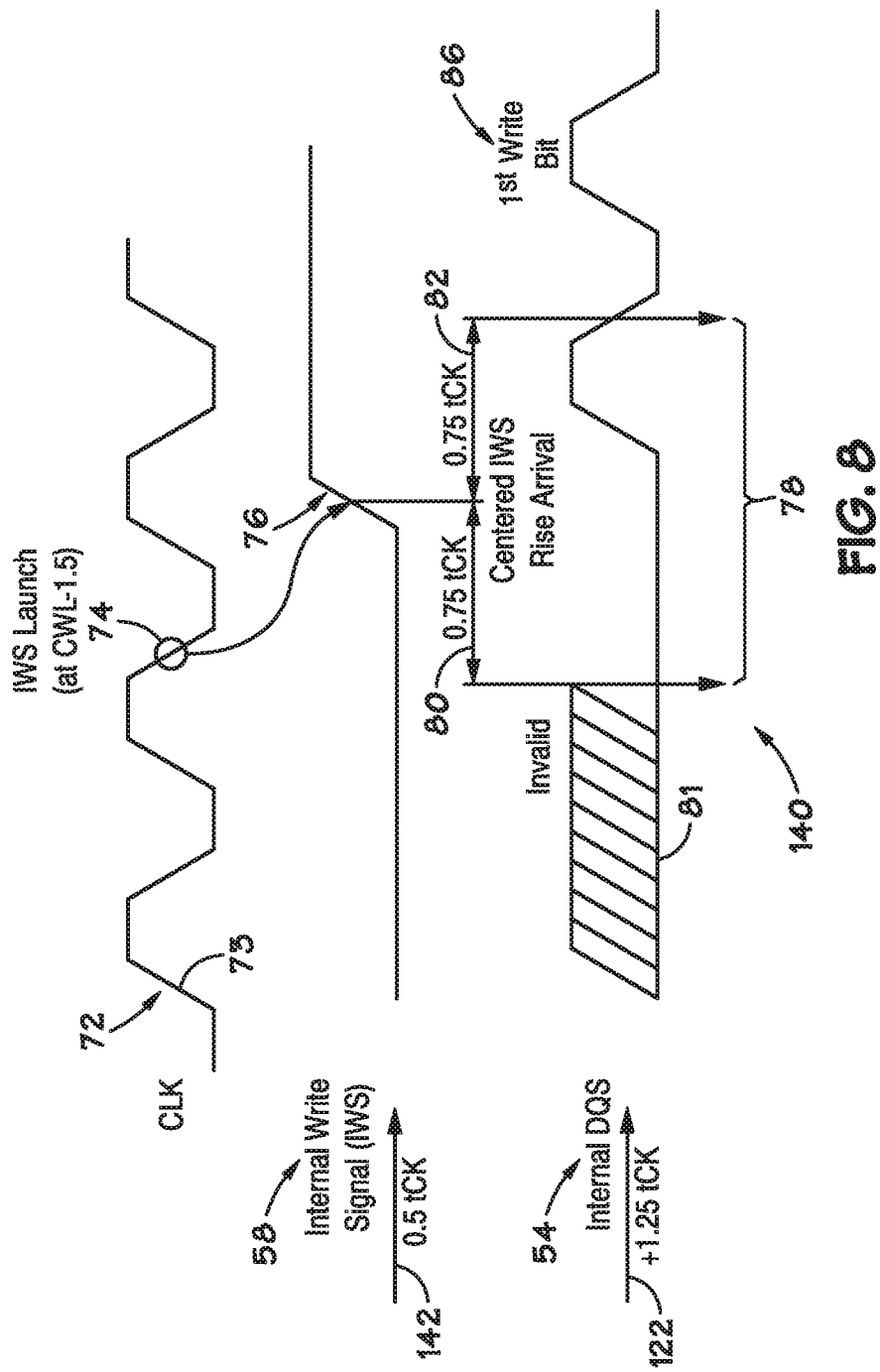
FIG. 8 is a timing diagram that includes write leveling training operations when internal write timings are enabled with a shift of the IWS, according to an embodiment of the present disclosure.

FIG. 8 illustrates a timing diagram 140 that includes write leveling training operations when internal write timings are enabled with a shift 142 of the IWS 58. As illustrated, the shift 142 of the IWS 58 is performed by moving the IWS launch 74 to the next falling edge from the rising edge depicted in FIG. 7. In some embodiments, the rising edge used in FIG. 7 for the IWS launch 74 may be only used during training. By adjusting the IWS 58 along with the internal DQS signal 54, the negative variation window 80 and the positive variation window 82 may become equal again to obtain equal window sizes on both sides of the edge 76 of the IWS 58.

Figure 9:
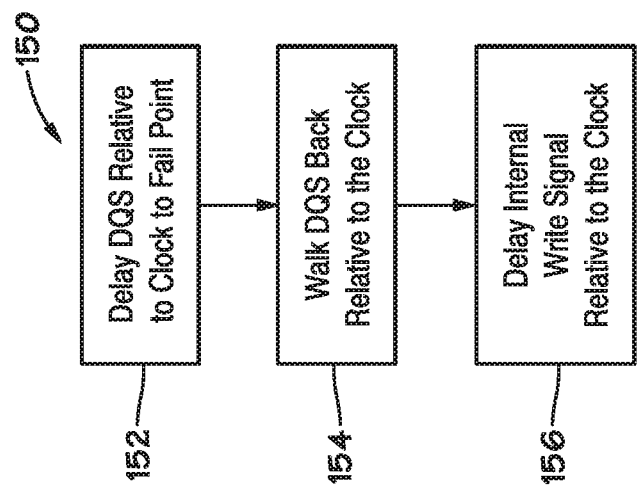
FIG. 9 is a flow diagram of a process for capturing a write command using an IWS shift, according to an embodiment of the present disclosure.

FIG. 9 is a flow diagram of a process 150 for capturing a write command using a shift of the IWS 58. The memory device 10/host device (controller) delays/shifts the received internal DQS signal 54 relative to a received clock to a fail point (block 152). For example, as previously noted, the fail point may correspond to a negative set up time for a flip flop to capture a write command by shifting DQS until the fail point occurs. The memory device 10/host device walks the internal DQS signal 54 back relative to the clock (block 154). As previously noted, this walk back of the internal DQS signal 54 may not re-center the edge 76 of the IWS 58 in the DQS period 78. To address this, the memory device 10 may shift/delay the IWS 58 by an amount (e.g., 0.5 tCK) (block 156). For example, a next falling edge may be used to launch the IWS 58 instead of a rising edge before the next falling edge. The shift of the internal DQS signal 54 and the IWS 54 may cause the edge 76 of the IWS 58 to occur at or near the center of a DQS period 78.

Figure 10:
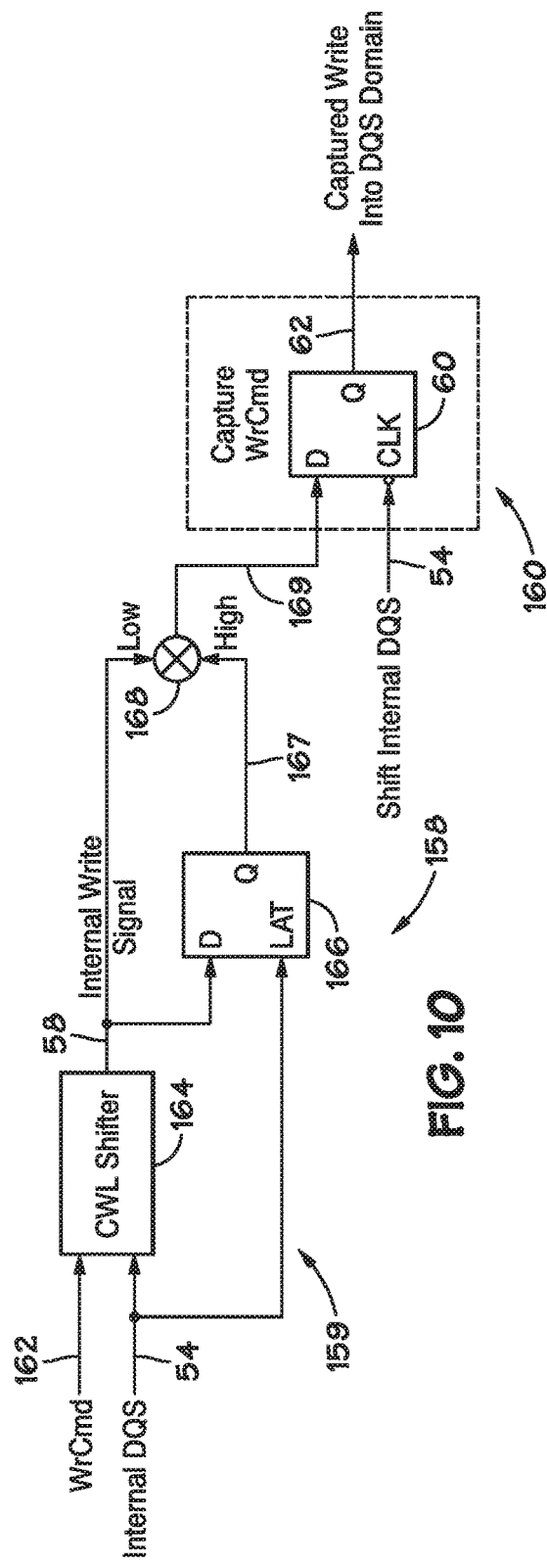
FIG. 10 is a schematic diagram of internal write adjust circuitry used to implement the process of FIG. 9, according to an embodiment of the present disclosure.

FIG. 10 is a schematic diagram of an embodiment of the IWA circuitry 48 that implements the process 150. A first part 159 of the IWA circuitry 48 may be implemented in the command decoder 32, and a second part 160 of the IWA circuitry 48 may be implemented in the datapath 46. The IWA circuitry 48 receives a write command 162 from the host device. The write command 162 and the internal DQS signal 54 are passed to a cas-write-latency (CWL) shifter 164 where write leveling shifting occurs. The CWL shifter 164 outputs the IWS 58. A latch 166 receives the IWS 58 and shifts it by some amount (e.g., 0.5 tCK) using the internal DQS signal 54 as to latch the IWS 58. A shifted IWS 167 is output from the latch 166 and passed along to a multiplexer 168 along with the unshifted IWS 58. The multiplexer selects whether the shifted IWS 167 or the unshifted IWS 58 are selected. For example, the shifted IWS 167 may be selected when a mode register for write leveling is enabled and the preamble is greater than a number (e.g., greater than one). Otherwise, the multiplexer 168 selects the unshifted IWS 58. In some embodiments, the multiplexer 168 may select between more than two modes. For example, additional latches may be included in the IWA circuitry 48 for various shift lengths for various preamble lengths with the multiplexer 168 selecting therebetween. The selected IWS 169 is then passed to the flip flop 60 which captures the write into the DQS domain using the internal DQS signal 54.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
  a command interface configured to receive a write command; and
  internal write adjust circuitry configured to:
    receive the write command from the command interface;
    generate an internal write signal (IWS) from the received write command;
    overshift a data strobe (DQS) signal using write leveling to an impermissible point outside of a specified permissible location relative to an IWS or to a point that causes communication failure for the memory device; and
    selectively shift the IWS based on a write preamble length to compensate for the overshift by centering a transition edge of the IWS in a DQS period.

2. The memory device of claim 1, comprising an amplifier that is configured to receive an external DQS signal and generate the DQS signal as an internal DQS signal.

3. The memory device of claim 1, wherein the DQS period begins when the DQS signal transitions from an indeterminate state.

4. The memory device of claim 1, wherein the DQS period ends when a last edge of the DQS signal occurs prior to a first write bit occurring.

5. The memory device of claim 1, wherein the internal write adjust circuitry comprises a write leveling shifter configured to overshift the DQS signal.

6. The memory device of claim 1, wherein the internal write adjust circuitry comprises a multiplexer configured to:
  select a first copy of the IWS in response to a first set of mode register indications corresponding to a first set of write preamble lengths; and
  select a second copy of the IWS in response to a second set of mode register indications corresponding to a second set of write preamble lengths.

7. The memory device of claim 6, wherein the first set of write preamble lengths are less than or equal to a threshold write preamble length, and the second set of write preamble lengths are greater than the threshold write preamble length.

8. The memory device of claim 7, wherein the threshold write preamble length comprises a write preamble length of 1 tCK.

9. The memory device of claim 6, wherein the first copy of the IWS comprises a non-shifted copy of the IWS, and the second copy of the IWS comprises a shifted copy of the IWS.

10. The memory device of claim 9, wherein the internal write adjust circuitry comprises a latch to shift the second copy of the IWS from the first copy of the IWS.

11. The memory device of claim 6, wherein the multiplexer is configured to select the first copy of the IWS when write leveling is not enabled, and to select the second copy of the IWS when write leveling is enabled and a write preamble length for a write falls in the second set of write preamble lengths.

12. A method, comprising:
  receiving a data strobe (DQS) signal at a memory device;
  shifting the DQS signal in a negative direction relative to a clock of the memory device to cause a fail point of a flip flop of the memory device;
  after causing the fail point, shifting the DQS signal in a positive direction relative to the clock; and
  centering a transition edge of an internal write signal (IWS) in a DQS period, wherein the IWS indicates that a write command is to be captured, and centering the transition edge by selectively delaying the IWS in the negative direction.

13. The method of claim 12, wherein the fail point of the flip flop comprises a failure to capture the IWS with the DQS signal due to a negative setup time for the flip flop to capture the IWS.

14. The method of claim 12, wherein shifting the DQS signal in the positive direction comprises applying write leveling using a write leveling shifter.

15. The method of claim 12, wherein selectively delaying the IWS comprises:
  delaying the IWS in the negative direction when a write preamble length is greater than a threshold; and
  foregoing the IWS delay in the positive direction when the write preamble length is less than a threshold.

16. The method of claim 12, wherein the DQS period comprises:
  a beginning when the DQS signal transitions from an indeterminate state; and
  an end when a last edge of the DQS signal occurs prior to a first write bit occurring.

17. The method of claim 12, wherein selectively delaying the IWS in the negative direction is configured to compensate for shifting DQS period past a center of the DQS period aligning with the transition edge when shifting the DQS signal in a positive direction relative to the clock.

18. An internal write adjust apparatus, comprising:
  generation circuitry configured to generate an internal write signal (IWS) indicative of a received write command configured to cause a write in a memory device including the internal write adjust apparatus;

delay circuitry configured to receive the IWS from the generation circuitry and to delay the IWS as a delayed IWS;

selection circuitry configured to select a selected IWS by choosing between the IWS and the delayed IWS; and capture circuitry configured to capture the selected IWS as a captured write command in a data strobe (DQS) domain by using an internal DQS signal to capture the selected IWS.

19. The internal write adjust apparatus of claim 18, wherein the generation circuitry is configured to generate the IWS using the received write command and the internal DQS signal.

20. The internal write adjust apparatus of claim 18, wherein the selection circuitry comprises a multiplexer configured to select between the IWS and the delayed IWS based at least in part on a write preamble length corresponding to the received write command.

* * * * *